US012685208B2

(12) United States Patent
Higashiuchi et al.

(10) Patent No.: US 12,685,208 B2
(45) Date of Patent: Jul. 14, 2026

(54) METHOD FOR MANUFACTURING SEMICONDUCTOR DEVICE INCLUDING DISPOSING AN ADHESIVE THERMAL INSULATION MATERIAL ON THE SEMICONDUCTOR DEVICE

(71) Applicant: Resonac Corporation, Tokyo (JP)

(72) Inventors: Tomoko Higashiuchi, Tokyo (JP); Hiroshi Yokota, Tokyo (JP); Tomohiko Kotake, Tokyo (JP); Naoki Furukawa, Tokyo (JP); Naoki Maruyama, Tokyo (JP); Yutaka Okada, Tokyo (JP); Nozomi Matsubara, Tokyo (JP)

(73) Assignee: Resonac Corporation, Tokyo (JP)

( * ) Notice: Subject to any disclaimer, the term of this patent is extended or adjusted under 35 U.S.C. 154(b) by 408 days.

(21) Appl. No.: 18/258,454

(22) PCT Filed: Dec. 20, 2021

(86) PCT No.: PCT/JP2021/047084
§ 371 (c)(1),
(2) Date: Jun. 20, 2023

(87) PCT Pub. No.: WO2022/138589
PCT Pub. Date: Jun. 30, 2022

(65) Prior Publication Data

US 2024/0047230 A1 Feb. 8, 2024

(30) Foreign Application Priority Data

Dec. 22, 2020 (JP) ................................ 2020-212317

(51) Int. Cl.
*H10W 74/01* (2026.01)
*H10W 72/00* (2026.01)

(52) U.S. Cl.
CPC .... *H10W 74/017* (2026.01); *H10W 72/07236* (2026.01); *H10W 72/07336* (2026.01)

(58) Field of Classification Search
CPC ......... H01L 21/566; H01L 2224/81815; H01L 2224/83815; H01L 2224/81935;
(Continued)

(56) References Cited

U.S. PATENT DOCUMENTS 9,553,041 B1 * 1/2017 Kelly .................. H01L 23/5384
2004/0150118 A1 * 8/2004 Honda .................... H01L 23/24
257/E21.503

(Continued)

FOREIGN PATENT DOCUMENTS

JP 2000-031342 A 1/2000
JP 2009-227867 A 10/2009
JP 2014-036192 A 2/2014

*Primary Examiner* — Khiem D Nguyen
(74) *Attorney, Agent, or Firm* — FITCH, EVEN, TABIN & FLANNERY, LLP

(57) ABSTRACT

A method for manufacturing a semiconductor device, the method including: a step of disposing an adhesive thermal insulation material on a semiconductor device; a step of performing reflow of the semiconductor device having the thermal insulation material disposed thereon; and a step of detaching the thermal insulation material from the semiconductor device.

9 Claims, 4 Drawing Sheets

(58) Field of Classification Search
CPC ......... H01L 23/562; H01L 2924/1435; H10W 74/017; H10W 74/473; H10W 72/01257; H10W 72/012; H10W 72/07236; H10W 72/073; H10W 72/07336; H10W 74/111; H10W 74/114; H10W 42/121
See application file for complete search history.

(56) References Cited

U.S. PATENT DOCUMENTS

| | | | | |
|---|---|---|---|---|
| 2005/0180481 | A1* | 8/2005 | Kaneko | H01S 5/0264<br>372/50.21 |
| 2017/0092611 | A1* | 3/2017 | Adema | H01L 24/29 |
| 2017/0176260 | A1* | 6/2017 | Ferguson | H01L 24/81 |
| 2020/0083418 | A1* | 3/2020 | Clark | H01L 21/563 |

* cited by examiner

METHOD FOR MANUFACTURING SEMICONDUCTOR DEVICE INCLUDING DISPOSING AN ADHESIVE THERMAL INSULATION MATERIAL ON THE SEMICONDUCTOR DEVICE

CROSS-REFERENCE TO RELATED APPLICATIONS

This application is a U.S. national phase application filed under 35 U.S.C. § 371 of International Application No PCT/JP2021/047084, filed Dec. 20, 2021, designating the United States, which claims priority from International Application 2020-212317, filed Dec. 22, 2020, which is incorporated herein by reference in its entirety.

TECHNICAL FIELD

The present invention relates to a method for manufacturing a semiconductor device.

BACKGROUND ART

Non-volatile memories, which feature low power consumption and high-speed read-write, are attracting attention as next-generation memory. For example, phase change memory (PCM), magnetoresistive memory (MRAM), and resistance change memory (ReRAM) are known. Non-volatile memories are vulnerable to heat, and quality maintenance when exposed to a high-temperature environment in a reflow step during mounting has become a problem.

In regard to this problem, for example, in Patent Literature 1, a non-volatile semiconductor memory device including an MRAM chip and an envelope that covers a portion or the entirety of the MRAM chip and has a thermal insulation region preventing thermal fluctuation in the magnetization of the storage layer, is disclosed.

CITATION LIST

Patent Literature

Patent Literature 1: Japanese Unexamined Patent Publication No. 2014-36192

SUMMARY OF INVENTION

Technical Problem

It is an object of the present invention to provide a novel method by which a semiconductor device can be protected from heat in a reflow step.

Solution to Problem

An aspect of the present invention is a method for manufacturing a semiconductor device, the method including: a step of disposing an adhesive thermal insulation material on a semiconductor device; a step of performing reflow of the semiconductor device having the thermal insulation material disposed thereon; and a step of detaching the thermal insulation material from the semiconductor device.

In this manufacturing method, since a semiconductor device is subjected to a reflow step in a state of having a thermal insulation material is disposed, the semiconductor device can be protected from heat in the reflow step. In addition, since the above-mentioned semiconductor device disclosed in Patent Literature 1 includes a thermal insulation region as one of constituent elements, the device still includes the thermal insulation region even after the reflow step, whereas in this manufacturing method, an adhesive thermal insulation material is used so that the thermal insulation material is detached from the semiconductor device after the reflow step. When the thermal insulation material remains in the device even after the reflow step, it is not preferable from the viewpoints of miniaturization of semiconductor devices, improvement in the degree of freedom in design, and the like, and therefore, such problems can be solved by detaching the thermal insulation material after the reflow step.

The thermal insulation material may satisfy the following Formula (A):

$$F1>F2 \quad (A)$$

In the Formula, F1 represents the adhesive strength of the thermal insulation material after heating the thermal insulation material at 220° C. for 120 seconds, and F2 represents the adhesive strength of the thermal insulation material after heating the thermal insulation material at 260° C. for 30 seconds.

It can be said that F1 and F2 correspond to the adhesive strengths of the thermal insulation material during a reflow step and after a reflow step, respectively. That is, when the thermal insulation material satisfies the Formula (A), since the adhesive strength of the thermal insulation material is relatively high during the reflow step, the thermal insulation material easily adheres to the semiconductor device and is capable of more suitably protecting the semiconductor device from heat, while at the same time, since the adhesive strength of the thermal insulation material is relatively low after the reflow step, the thermal insulation material can be easily detached from the semiconductor device.

The thermal insulation material may satisfy the following Formula (B):

$$F0 \leq F1 \quad (B)$$

In the Formula, F0 represents the adhesive strength of the thermal insulation material at 25° C., and F1 represents the adhesive strength of the thermal insulation material after heating the thermal insulation material at 220° C. for 120 seconds.

It can be said that F0 and F1 correspond to the adhesive strengths of the thermal insulation material before a reflow step (for example, a step of disposing the thermal insulation material on a semiconductor device) and during the reflow step, respectively. That is, when the thermal insulation material satisfies the Formula (B), since the adhesive strength of the thermal insulation material is relatively low before the reflow step (for example, a step of disposing the thermal insulation material on a semiconductor device), handling of the thermal insulation material is easy, while at the same time, since the adhesive strength of the thermal insulation material is relatively high during the reflow step, the thermal insulation material easily adheres to the semiconductor device and is capable of more suitably protecting the semiconductor device from heat.

The thermal insulation material may contain a matrix polymer and thermally expandable hollow particles. In this case, as the thermally expandable hollow particles expand during the reflow step, the interface adherence between the thermal insulation material and the semiconductor device may be decreased after the reflow step. Therefore, the thermal insulation material can be easily detached from the semiconductor device after the reflow step.

With regard to the step of disposing a thermal insulation material, a thermal insulation material molded in advance into a sheet shape may be disposed. In this case, in a case where the area to which the thermal insulation material is provided is large, the thermal insulation material can be easily disposed all at once.

With regard to the step of disposing a thermal insulation material, a liquid thermal insulation material precursor may be disposed on a semiconductor device, and then the thermal insulation material precursor may be cured. By using a liquid thermal insulation material precursor, the thermal insulation material can be easily disposed even when the place where the thermal insulation material needs to be disposed is narrow or has a complicated shape.

Advantageous Effects of Invention

According to the present invention, a novel method by which a semiconductor device can be protected from heat in a reflow step is provided.

DESCRIPTION OF EMBODIMENTS

An embodiment of the present invention is a method for manufacturing a semiconductor device, the method including a disposition step of disposing an adhesive thermal insulation material on a semiconductor device; a reflow step of performing reflow of the semiconductor device having the thermal insulation material disposed thereon; and a detachment step of detaching the thermal insulation material from the semiconductor device.

Figure 1:
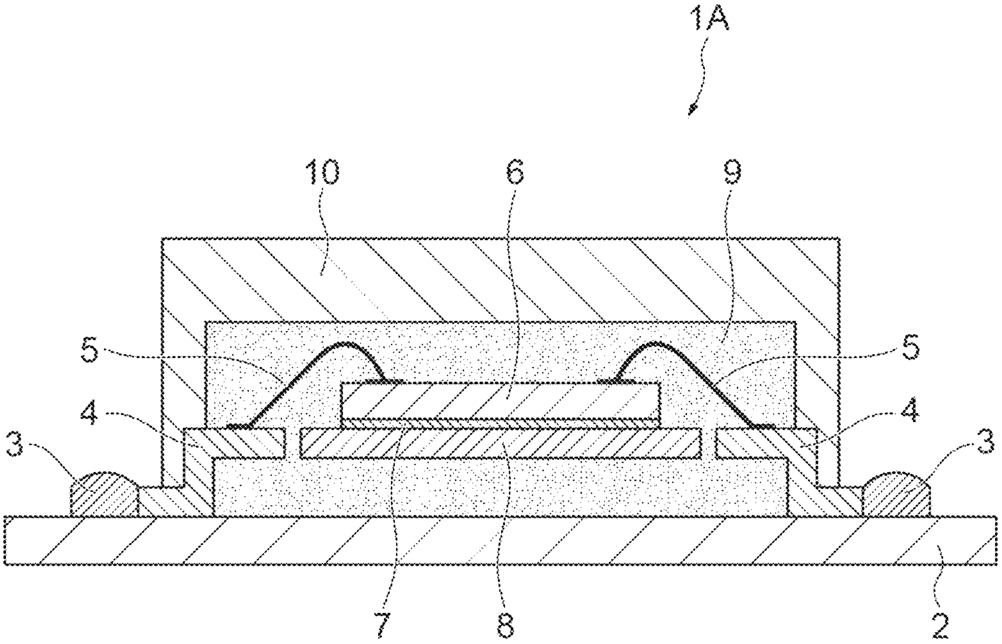
FIG. 1 is a schematic cross-sectional view illustrating an embodiment of a disposition step.

FIG. 1 is a schematic cross-sectional view illustrating an embodiment of the disposition step. As shown in FIG. 1, a semiconductor device (also referred to as semiconductor package) 1A used in the disposition step includes, for example, a substrate 2, leads 4 connected to the substrate 2 with solder (solder paste) 3, and a semiconductor chip 6 connected to the leads 4 through wires 5. The semiconductor chip 6 is mounted on a die pad 8, with a die attach material 7 interposed therebetween, and is also covered with an encapsulant material 9.

The thermal insulation material is disposed on at least a portion of the surface of such a semiconductor device 1A. According to an embodiment, a thermal insulation material 10 is disposed on the semiconductor device 1A so as to cover the entire surface of the encapsulant material 9. According to another embodiment, the thermal insulation material 10 may be disposed to cover a portion (for example, only the top face) of the surface of the encapsulant material 9.

Figure 2:
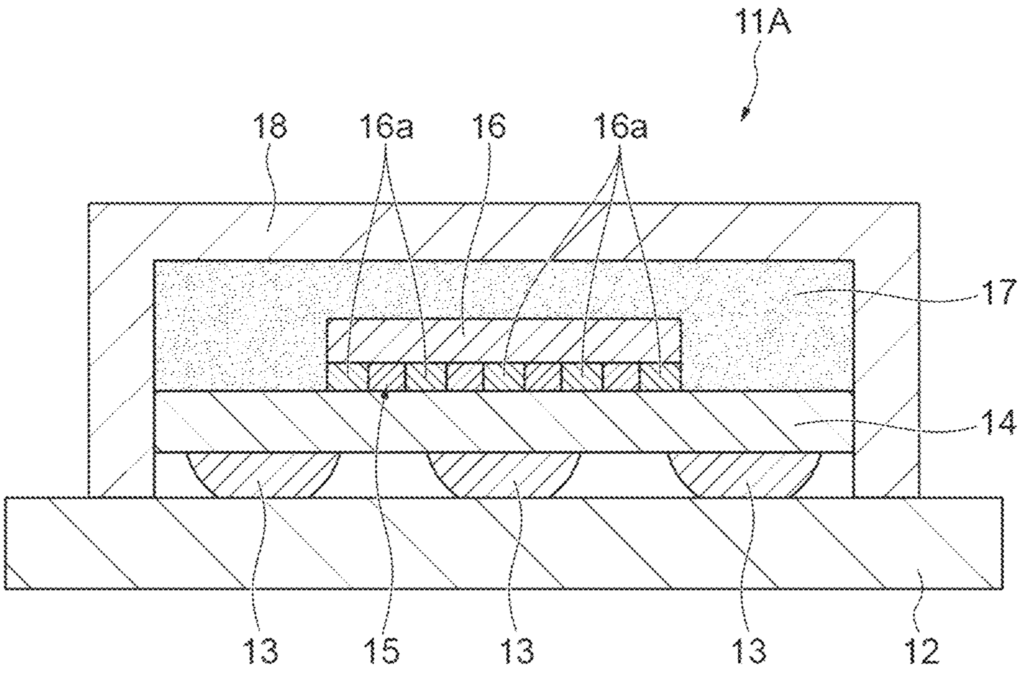
FIG. 2 is a schematic cross-sectional view illustrating another embodiment of the disposition step.

FIG. 2 is a schematic cross-sectional view illustrating another embodiment of the disposition step. As shown in FIG. 2, in another embodiment, a semiconductor device 11A used in the disposition step includes, for example, a substrate 12, an interposer 14 connected to the substrate 12 with solder (solder balls) 13, and a semiconductor chip 16 connected to the interposer 14 through a bonding adhesive 15. The semiconductor chip 16 is connected to the interposer 14 by a plurality of protruding electrodes (bumps) 16*a*. The semiconductor chip 16 is covered with an encapsulant material 17 disposed on the interposer 14.

The thermal insulation material is disposed on at least a portion of the surface of such a semiconductor device 11A. According to an embodiment, the thermal insulation material 18 is disposed on the semiconductor device 11A so as to cover the entire surface of the encapsulant material 17 and all of the side faces of the place where the solder (solder balls) 13 and the interposer 14 are disposed.

As another embodiment of the disposition step shown in FIG. 2, the thermal insulation material 18 may be disposed so as to cover the entire surface of the encapsulant material 17 and only the side faces of the place where the interposer 14 is disposed (the thermal insulation material 18 does not have to be disposed at the side faces of the place where the solder (solder balls) 13 is disposed). According to another embodiment, the thermal insulation material 18 may be disposed so as to cover only the entire surface of the encapsulant material 17 or may be disposed so as to cover only a portion of the surface (for example, top face) of the encapsulant material 17. Even in this case, the thermal insulation material 18 can suitably protect the semiconductor device from heat in the reflow step. However, for example, in a case where low-temperature solder is used as the solder (solder ball) 13, from the viewpoint that the solder (solder balls) 13 can be protected from excess heat in the reflow step, and damage at the solder junctions can be suppressed, the thermal insulation material 18 is preferably disposed so as to cover the entire surface of the encapsulant material 17 and all of the side faces of the place where the solder (solder balls) 13 and the interposer 14 are disposed, as shown in FIG. 2.

According to another embodiment, a plurality of semiconductor devices (semiconductor packages) may be mounted on one substrate 2 or 12, and some or all of the plurality of semiconductor devices may be the above-mentioned semiconductor devices 1A or 11A. When some of a plurality of semiconductor devices are the above-mentioned semiconductor devices 1A or 11A, the remaining semiconductor devices may be semiconductor devices that are more resistant to heat (having higher heat resistance) than the above-mentioned semiconductor devices 1A or 11A, and the solder in the remaining semiconductor devices may be a solder that is joined at a higher temperature than the solder 3 or 13 for the above-mentioned semiconductor device 1A or 11A. In this way, even when a plurality of semiconductor devices (semiconductor packages) having different heat resistance characteristics are mounted on one substrate 2 or 12, a plurality of semiconductor devices (semiconductor packages) having different heat resistance characteristics can be submitted to the reflow step all at once by disposing the thermal insulation material 10 or 18 on the semiconductor devices 1A or 11A that are more vulnerable to heat (having lower heat resistance).

Figure 3:
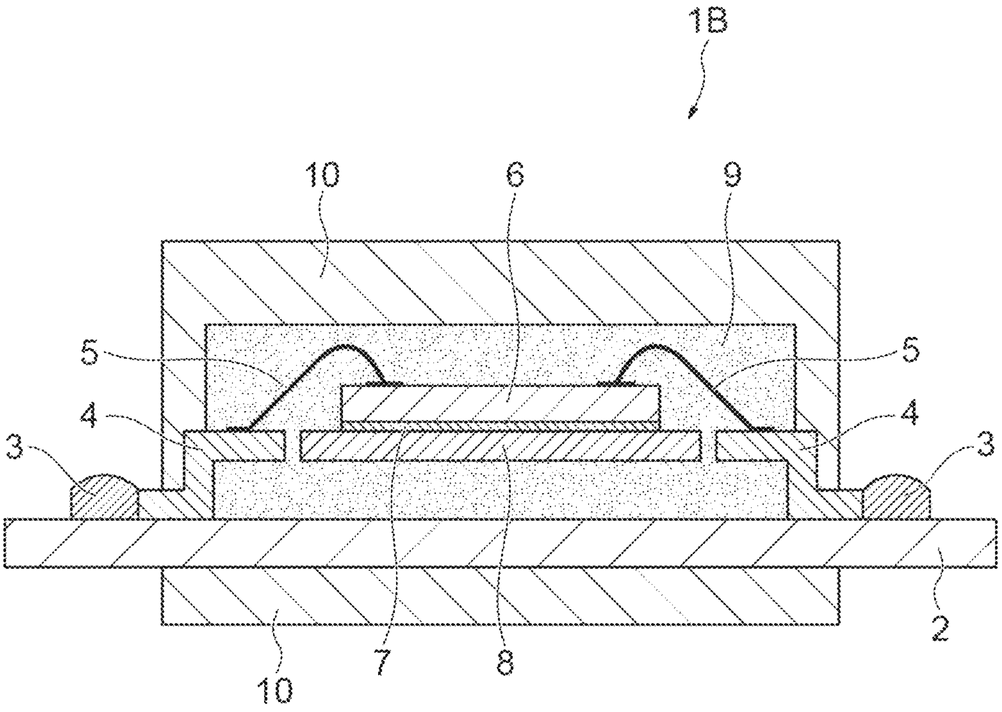
FIG. 3 is a schematic cross-sectional view illustrating another embodiment of the disposition step.
Figure 4:
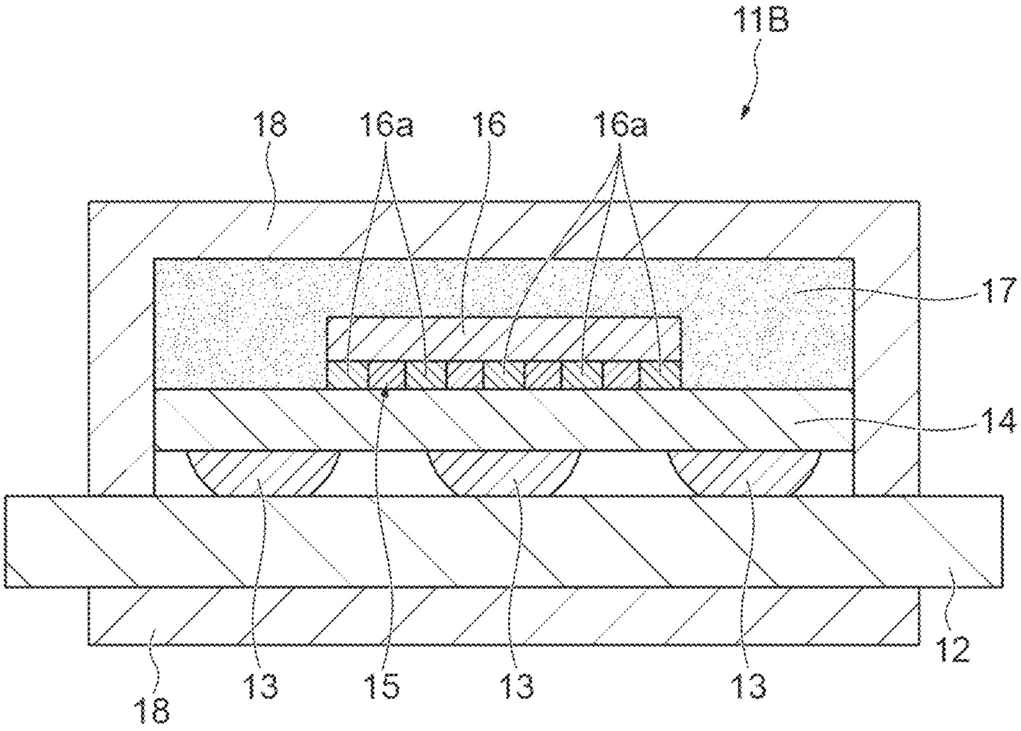
FIG. 4 is a schematic cross-sectional view illustrating another embodiment of the disposition step.

According to another embodiment, the thermal insulation material may be disposed on a face of the substrate on the opposite side from the face where a semiconductor chip is mounted. FIG. 3 is a schematic cross-sectional view illustrating another embodiment of the disposition step shown in FIG. 1. As shown in FIG. 3, the thermal insulation material 10 is also disposed on a face of a substrate 2 on the opposite side from the face where a semiconductor chip 6 is mounted. Furthermore, FIG. 4 is a schematic cross-sectional view illustrating another embodiment of the disposition step shown in FIG. 2. As shown in FIG. 4, the thermal insulation material 18 is disposed also on the face of the substrate 12 on the opposite side from the face where the semiconductor chip 16 is mounted. In these embodiments, for example, in a case where a plurality of semiconductor devices (semiconductor packages) having different heat resistance characteristics are mounted on one substrate 2 or 12, or the like, a plurality of semiconductor devices (semiconductor packages) having different heat resistance characteristics can be submitted all at once to the reflow step by disposing more thermal insulation material 10 or 18 on the semiconductor device 1B or 11B, which is more vulnerable to heat (having lower heat resistance).

The thermal insulation material is not particularly limited as long as it has desired thermal insulation performance. The thermal insulation material is preferably a thermal insulation material satisfying the following Formula (A):

$$F1>F2 \quad \text{(A)}$$

In the Formula, F1 represents the adhesive strength of the thermal insulation material after heating the thermal insulation material at 220° C. for 120 seconds, and F2 represents the adhesive strength of the thermal insulation material after heating the thermal insulation material at 260° C. for 30 seconds.

More specifically, F1 means the adhesive strength of a thermal insulation material obtained by sticking an unheated thermal insulation material to a slide glass at 25° C., leaving the material to stand for 15 minutes, subsequently heating the material at 220° C. for 120 seconds, and then cooling the material to 25° C., the adhesive strength being measured by using a tensile tester (for example, "EZ Test EZ-S" manufactured by SHIMADZU CORPORATION) under the conditions of 90° peeling and a tensile rate of 50 mm/min. F2 means the adhesive strength of a thermal insulation material obtained by sticking an unheated thermal insulation material to a slide glass at 25° C., leaving the material to stand for 15 minutes, subsequently heating the material at 260° C. for 30 seconds, and then cooling the material to 25° C., the adhesive strength being measured in the same manner as described above.

It can be said that F1 and F2 in the Formula (A) correspond to the adhesive strengths of a thermal insulation material during a reflow step and after a reflow step, respectively. That is, when the thermal insulation material satisfies the Formula (A), since the adhesive strength of the thermal insulation material is relatively high during the reflow step, the thermal insulation material easily adheres to the semiconductor device, and can suitably protect the semiconductor device from heat, and at the same time, since the adhesive strength of the thermal insulation material is relatively low after the reflow step, the thermal insulation material can be easily detached from the semiconductor device.

The thermal insulation material is preferably a thermal insulation material satisfying the following Formula (B):

$$F0 \leq F1 \quad \text{(B)}$$

In the Formula, F0 represents the adhesive strength of the thermal insulation material at 25° C., and F1 represents the adhesive strength of the thermal insulation material after heating the thermal insulation material at 220° C. for 120 seconds.

More specifically, F0 means the adhesive strength obtained by sticking an unheated thermal insulation material to a slide glass at 25° C., leaving the material to stand for 15 minutes, and subsequently measuring the adhesive strength in the same manner as described above. Incidentally, when it is said that a thermal insulation material has adhesiveness, it means that this F0 is 10 N/m or more.

It can be said that F0 and F1 in the Formula (B) correspond to the adhesive strengths of a thermal insulation material before a reflow step (for example, a step of disposing a thermal insulation material on a semiconductor device) and during a reflow step, respectively. That is, when the thermal insulation material satisfies the Formula (B), since the adhesive strength of the thermal insulation material is relatively low before a reflow step (for example, a step of disposing a thermal insulation material on a semiconductor device), handling of the thermal insulation material is easy, and at the same time, since the adhesive strength of the thermal insulation material is relatively high during a reflow step, the thermal insulation material is easily attached to a semiconductor device and can protect the semiconductor device more suitably from heat.

From the same viewpoint as described above, the thermal insulation material is more preferably a thermal insulation material that satisfies both the above-described Formula (A) and Formula (B).

A thermal insulation material having adhesion characteristics such as described above contains, for example, a matrix polymer and hollow particles. The thermal insulation material may be, for example, a cured product obtainable by curing a thermal insulation material precursor, containing a monomer component constituting a monomer unit of the matrix polymer and hollow particles (polymerizing a monomer in the precursor).

In the disposition step, according to an embodiment, a thermal insulation material molded in advance into a sheet shape (obtained by curing a thermal insulation material precursor in advance) may be disposed. A method of disposing a thermal insulation material molded in advance into a sheet shape may include a pressure-bonding step of pressure-bonding a thermal insulation material on a semiconductor device (semiconductor package) in a vacuum or under atmospheric pressure.

In the pressure-bonding step, specifically, for example, first, a cushioning material (for example, a rubber sheet), a mold release film, a semiconductor device (semiconductor package), a thermal insulation material, and a mold release film are stacked in this order in a chamber of a vacuum laminator (for example, "V-130" manufactured by Nikko-Materials Co., Ltd.). Subsequently, when a vacuum is drawn inside the chamber, and then pressure is applied such that the thermal insulation material closely adheres to the semiconductor device (semiconductor package), the thermal insulation material can be pressure-bonded to the semiconductor device (semiconductor package). As another specific example, first, a semiconductor device (semiconductor package), a thermal insulation material, and a mold release film are stacked in this order on a support (for example, a stainless steel plate). Subsequently, when the stacked materials are inserted into a roll laminator (for example, "VA-770H Special Type Laminator" manufactured by TAISEI LAMINATOR CO., LTD.), and pressure is applied such that the thermal insulation material closely adheres to the semiconductor device (semiconductor package), the thermal insulation material can be pressure-bonded to the semiconductor device (semiconductor package).

In the disposition step, according to another embodiment, the thermal insulation material may be disposed by disposing a liquid thermal insulation material precursor on the semiconductor device and then curing the thermal insulation material precursor.

From the viewpoint that the thermal insulation material has low elasticity and excellent elongation and can enhance the conformability to the shape of the semiconductor device, the monomer component may contain a compound represented by the following Formula (1):

[Chemical Formula 1]

(1)

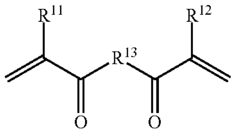

In the Formula (1), $R^{11}$ and $R^{12}$ each independently represent a hydrogen atom or a methyl group, and $R^{13}$ represents a divalent group having a polyoxyalkylene chain.

According to an embodiment, one of $R^{11}$ and $R^{12}$ may be a hydrogen atom while the other may be a methyl group; according to another embodiment, both $R^{11}$ and $R^{12}$ may be hydrogen atoms; and according to another embodiment, both $R^{11}$ and $R^{12}$ may be methyl groups.

According to an embodiment, the polyoxyalkylene chain contains a structural unit represented by the following Formula (2). As a result, the strength of the thermal insulation material can be increased while suppressing an excessive increase in the viscosity of the thermal insulation material precursor.

[Chemical Formula 2]

(2)

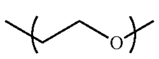

In this case, $R^{13}$ may be a divalent group having a polyoxyethylene chain, and the compound represented by the Formula (1) is preferably a compound represented by the following Formula (1-2) (polyethylene glycol di(meth)acrylate).

[Chemical Formula 3]

(1-2)

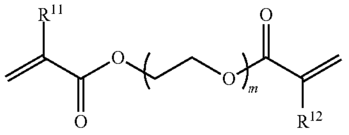

In the Formula (1-2), $R^{11}$ and $R^{12}$ have the same meanings as $R^{11}$ and $R^{12}$ in the Formula (1), respectively, and m is an integer of 2 or greater.

According to another embodiment, the polyoxyalkylene chain contains a structural unit represented by the following Formula (3). As a result, handling of the thermal insulation material precursor can be facilitated.

[Chemical Formula 4]

(3)

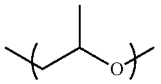

In this case, $R^{13}$ may be a divalent group having a polyoxypropylene chain, and the compound represented by the Formula (1) is preferably a compound represented by the following Formula (1-3) (polypropylene glycol di(meth) acrylate).

[Chemical Formula 5]

(1-3)

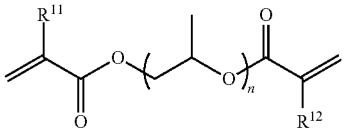

In the Formula (1-3), $R^{11}$ and $R^{12}$ have the same meanings as $R^{11}$ and $R^{12}$ in the Formula (1), respectively, and n is an integer of 2 or greater.

According to another embodiment, from the viewpoint of making it easier to achieve both the strength of the thermal insulation material of the compound represented by the Formula (1) and the handleability of the thermal insulation material precursor, the polyoxyalkylene chain is preferably a copolymer chain containing the above-mentioned structural unit represented by the Formula (2) and the above-mentioned structural unit represented by the Formula (3). The copolymer chain may be any of an alternating copolymer chain, a block copolymer chain, or a random copolymer chain. From the viewpoint that the crystallinity of the compound represented by the Formula (1) can be further lowered, and handling of the thermal insulation material precursor can be further facilitated, the copolymer chain is preferably a random copolymer chain.

In each of the above-mentioned embodiments, the polyoxyalkylene chain may have an oxyalkylene group having 4 or 5 carbon atoms, such as an oxytetramethylene group, an oxybutylene group, or an oxypentylene group, as a structural unit in addition to the structural unit represented by the Formula (2) and the structural unit represented by the Formula (3).

$R^{13}$ may also be a divalent group further having an additional organic group, in addition to the above-mentioned polyoxyalkylene chain. The additional organic group may be a chain-shaped group other than a polyoxyalkylene chain, and examples include a methylene chain (a chain having $—CH_2—$ as a structural unit), a polyester chain (a chain having —COO— in a structural unit), and a polyurethane chain (a chain containing —OCON— in a structural unit).

For example, the compound represented by the Formula (1) may be a compound represented by the following Formula (1-4).

[Chemical Formula 6]

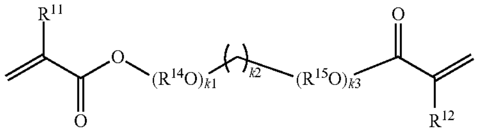
(1-4)

In the Formula (1-4), $R^{11}$ and $R^{12}$ have the same meanings as $R^{11}$ and $R^{12}$ in the Formula (1), respectively; $R^{14}$ and $R^{15}$ each independently represent an alkylene group having 2 to 5 carbon atoms; and k1, k2, and k3 each independently represent an integer of 2 or greater. k2 may be, for example, an integer of 16 or less.

A plurality of $R^{14}$ present therein may be identical to each other or may be different from each other, and a plurality of $R^{15}$ present therein may be identical to each other or may be different from each other. A plurality of $R^{14}$ and a plurality of $R^{15}$ present therein each preferably contains an ethylene group and a propylene group. That is, each of the polyoxyalkylene chain represented by $(R^{14}O)_{k1}$ and the polyoxyalkylene chain represented by $(R^{15}O)_{k3}$ is preferably a copolymer chain containing an oxyethylene group (the above-described structural unit represented by the Formula (2)) and an oxypropylene group (the above-described structural unit represented by the Formula (3)).

In each of the above-mentioned embodiments, the number of oxyalkylene groups in the polyoxyalkylene chain is preferably 100 or greater. When the number of oxyalkylene groups in the polyoxyalkylene chain is 100 or greater, as the main chain of the compound represented by the Formula (1) is lengthened, the elongation of the thermal insulation material is more excellent, and the strength of the thermal insulation material can also be increased. The number of oxyalkylene groups corresponds to each of m in the Formula (1-2), n in the Formula (1-3), and k1 and k3 in the Formula (1-4).

The number of oxyalkylene groups in the polyoxyalkylene chain is more preferably 130 or greater, 180 or greater, 200 or greater, 220 or greater, 250 or greater, 270 or greater, 300 or greater, or 320 or greater. The number of oxyalkylene groups in the polyoxyalkylene chain may be 600 or less, 570 or less, or 530 or less.

From the viewpoint that the thermal insulation material has lower elasticity and more excellent elongation, the weight average molecular weight of the compound represented by the Formula (1) is preferably 5000 or more, 6000 or more, 7000 or more, 8000 or more, 9000 or more, 10000 or more, 11000 or more, 12000 or more, 13000 or more, 14000 or more, or 15000 or more. From the viewpoint of facilitating adjustment of the viscosity of the thermal insulation material precursor, the weight average molecular weight of the compound represented by the Formula (1) is preferably 100000 or less, 80000 or less, 60000 or less, 34000 or less, 31000 or less, or 28000 or less.

The compound represented by the Formula (1) may be liquid at 25° C. In this case, from the viewpoint of facilitating application on a coating surface and from the viewpoint of increasing the adhesiveness of the thermal insulation material to the coating surface, the viscosity at 25° C. of the compound represented by the Formula (1) is preferably 1000 Pa·s or less, 800 Pa·s or less, 600 Pa·s or less, 500 Pa·s or less, 350 Pa·s or less, 300 Pa·s or less, or 200 Pa·s or less. The viscosity at 25° C. of the compound represented by the Formula (1) may be 0.1 Pa·s or more, 0.2 Pa·s or more, 0.3 Pa·s or more, 1 Pa·s or more, 2 Pa·s or more, or 3 Pa·s or more.

The compound represented by the Formula (1) may be solid at 25° C. In this case, from the viewpoint of further improving the handleability of the thermal insulation material precursor, the compound represented by the Formula (1) is preferably liquid at 50° C. Furthermore, in this case, from the viewpoint of further improving the handleability of the thermal insulation material precursor, the viscosity at 50° C. of the compound represented by the Formula (1) is preferably 100 Pa·s or less, more preferably 50 Pa·s or less, even more preferably 30 Pa·s or less, and particularly preferably 20 Pa·s or less. The viscosity at 50° C. of the compound represented by the Formula (1) may be 0.1 Pa·s or more, 0.2 Pa·s or more, or 0.3 Pa·s or more.

The viscosity means a value measured based on JIS Z 8803 and specifically means a value measured with an E-type viscometer (for example, PE-80L manufactured by Toki Sangyo Co., Ltd.). Incidentally, calibration of the viscometer can be carried out based on JIS Z 8809-JS 14000. The viscosity of the compound represented by the Formula (1) can be adjusted by adjusting the weight average molecular weight of the compound.

From the viewpoint that the thermal insulation material has lower elasticity and more excellent elongation, the content of the compound represented by the Formula (1) is preferably 10% by mass or more, 20% by mass or more, 30% by mass or more, or 40% by mass or more, based on the total amount of the thermal insulation material precursor. The content of the compound represented by the Formula (1) may be 90% by mass or less, 80% by mass or less, 70% by mass or less, 60% by mass or less, or 50% by mass or less, based on the total amount of the thermal insulation material precursor.

From the viewpoint that the thermal insulation material has lower elasticity and more excellent elongation, the content of the compound represented by the Formula (1) is preferably 20 parts by mass or more, 30 parts by mass or more, or 40 parts by mass or more, with respect to a total of 100 parts by mass of the monomer component. The content of the compound represented by the Formula (1) may be 80 parts by mass or less, 70 parts by mass or less, or 60 parts by mass or less, with respect to a total of 100 parts by mass of the monomer component.

The monomer component may further contain an additional monomer capable of copolymerization with the above-mentioned compound represented by the Formula (1), for the purpose of adjusting the physical properties of the thermal insulation material precursor, and the like.

The additional monomer may be, for example, a compound having one (meth)acryloyl group. This compound may be, for example, an alkyl (meth)acrylate. The additional monomer may also be a compound having, in addition to the one (meth)acryloyl group, an aromatic hydrocarbon group, a group containing a polyoxyalkylene chain, a group containing a heterocyclic ring, an alkoxy group, a phenoxy group, a group containing a silane group, a group containing a siloxane bond, a halogen atom, a hydroxyl group, a carboxyl group, an amino group, or an epoxy group. Particularly, when the thermal insulation material precursor contains an alkyl (meth)acrylate, the viscosity of the thermal insulation material precursor can be adjusted. Furthermore, when the thermal insulation material precursor contains a compound having a hydroxyl group, a carboxyl group, an amino group, or an epoxy group in addition to a (meth) acryloyl group, the adhesiveness of the thermal insulation material precursor and the thermal insulation material to an object can be further improved.

The alkyl group (alkyl group moiety other than the (meth)acryloyl group) in an alkyl (meth)acrylate may be linear, branched, or alicyclic. The number of carbon atoms of the alkyl group may be, for example, 1 to 30. The number of carbon atoms of the alkyl group may be 1 to 11, 1 to 8, 1 to 6, or 1 to 4 and may be 12 to 30, 12 to 28, 12 to 24, 12 to 22, 12 to 18, or 12 to 14.

Examples of the alkyl (meth)acrylate having a linear alkyl group include an alkyl (meth)acrylate having a linear alkyl group having 1 to 11 carbon atoms, such as methyl (meth) acrylate, ethyl (meth)acrylate, propyl (meth)acrylate, butyl (meth)acrylate, pentyl (meth)acrylate, n-hexyl (meth)acrylate, n-heptyl (meth)acrylate, octyl (meth)acrylate, nonyl (meth)acrylate, decyl (meth)acrylate, or undecyl (meth) acrylate; and an alkyl (meth)acrylate having a linear alkyl group having 12 to 30 carbon atoms, such as dodecyl (meth)acrylate (lauryl (meth)acrylate), tetradecyl (meth) acrylate, hexadecyl (meth)acrylate (cetyl (meth)acrylate), octadecyl (meth)acrylate (stearyl (meth)acrylate), docosyl (meth)acrylate (behenyl (meth)acrylate), tetracosyl (meth) acrylate, hexacosyl (meth)acrylate, or octacosyl (meth)acrylate.

Examples of the alkyl (meth)acrylate having a branched alkyl group include an alkyl (meth)acrylate having a branched alkyl group having 1 to 11 carbon atoms, such as s-butyl (meth)acrylate, t-butyl (meth)acrylate, isobutyl (meth)acrylate, isopentyl (meth)acrylate, isoamyl (meth) acrylate, isooctyl (meth)acrylate, 2-ethylhexyl (meth)acrylate, isononyl (meth)acrylate, or isodecyl (meth)acrylate; and an alkyl (meth)acrylate having a branched alkyl group having 12 to 30 carbon atoms, such as isomyristyl (meth) acrylate, 2-propylheptyl (meth)acrylate, isoundecyl (meth) acrylate, isododecyl (meth)acrylate, isotridecyl (meth)acrylate, isopentadecyl (meth)acrylate, isohexadecyl (meth) acrylate, isoheptadecyl (meth)acrylate, isostearyl (meth) acrylate, or decyltetradecanyl (meth)acrylate.

Examples of the alkyl (meth)acrylate having an alicyclic alkyl group (cycloalkyl group) include cyclohexyl (meth) acrylate, 3,3,5-trimethylcyclohexyl (meth)acrylate, isobornyl (meth)acrylate, terpene (meth)acrylate, or dicyclopentanyl (meth)acrylate.

Examples of the compound having a (meth)acryloyl group and an aromatic hydrocarbon group include benzyl (meth)acrylate.

Examples of the compound having a (meth)acryloyl group and a group containing a polyoxyalkylene chain include polyethylene glycol (meth)acrylate, methoxy polyethylene glycol (meth)acrylate, polypropylene glycol (meth) acrylate, methoxy polypropylene glycol (meth)acrylate, polybutylene glycol (meth)acrylate, and methoxy polybutylene glycol (meth)acrylate.

Examples of the compound having a (meth)acryloyl group and a group containing a heterocyclic ring include tetrahydrofurfuryl (meth)acrylate.

Examples of the compound having a (meth)acryloyl group and an alkoxy group include 2-methoxyethyl acrylate.

Examples of the compound having a (meth)acryloyl group and a phenoxy group include phenoxyethyl (meth) acrylate.

Examples of the compound having a (meth)acryloyl group and a group containing a silane group include 3-acryloxypropyltriethoxysilane, 10-methacryloyloxydecyltrimethoxysilane, 10-acryloyloxydecyltrimethoxysilane, 10-methacryloyloxydecyltriethoxysilane, and 10-acryloyloxydecyltriethoxysilane.

Examples of the compound having a (meth)acryloyl group and a group containing a siloxane bond include silicone (meth)acrylate.

Examples of the compound having a (meth)acryloyl group and a halogen atom include (meth)acrylates having fluorine atoms, such as trifluoromethyl (meth)acrylate, 2,2,2-trifluoroethyl (meth)acrylate, 1,1,1,3,3,3-hexafluoro-2-propyl (meth)acrylate, perfluoroethylmethyl (meth)acrylate, perfluoropropylmethyl (meth)acrylate, perfluorobutylmethyl (meth)acrylate, perfluoropentylmethyl (meth)acrylate, perfluorohexylmethyl (meth)acrylate, perfluoroheptylmethyl (meth)acrylate, perfluorooctylmethyl (meth)acrylate, perfluorononylmethyl (meth)acrylate, perfluorodecylmethyl (meth)acrylate, perfluoroundecylmethyl (meth)acrylate, perfluorododecylmethyl (meth)acrylate, perfluorotridecylmethyl (meth)acrylate, perfluorotetradecylmethyl (meth)acrylate, 2-(trifluoromethyl)ethyl (meth)acrylate, 2-(perfluoroethyl)ethyl (meth)acrylate, 2-(perfluoropropyl) ethyl (meth)acrylate, 2-(perfluorobutyl)ethyl (meth)acrylate, 2-(perfluoropentyl)ethyl (meth)acrylate, 2-(perfluorohexyl) ethyl (meth)acrylate, 2-(perfluoroheptyl)ethyl (meth)acrylate, 2-(perfluorooctyl)ethyl (meth)acrylate, 2-(perfluorononyl)ethyl (meth)acrylate, 2-(perfluorotridecyl)ethyl (meth)acrylate, and 2-(perfluorotetradecyl)ethyl (meth)acrylate.

Examples of the compound having a (meth)acryloyl group and a hydroxyl group include hydroxyalkyl (meth) acrylates such as 2-hydroxyethyl (meth)acrylate, 2-hydroxypropyl (meth)acrylate, 3-hydroxypropyl (meth)acrylate, 2-hydroxybutyl (meth)acrylate, 4-hydroxybutyl (meth)acrylate, 6-hydroxyhexyl (meth)acrylate, 8-hydroxyoctyl (meth) acrylate, 10-hydroxydecyl (meth)acrylate, and 12-hydroxylauryl (meth)acrylate; and hydroxyalkylcycloalkane (meth) acrylates such as (4-hydroxymethylcyclohexyl)methyl (meth)acrylate.

Examples of the compound having a (meth)acryloyl group and a carboxyl group include (meth)acrylic acid, carboxyethyl (meth)acrylate, carboxypentyl (meth)acrylate, phthalic acid monohydroxyethyl acrylate (for example, "ARONIX M5400" manufactured by TOAGOSEI CO., LTD.), and 2-acryloyloxyethyl succinate (for example, "NK ESTER A-SA" manufactured by SHIN-NAKAMURA CHEMICAL Co., Ltd.).

Examples of the compound having a (meth)acryloyl group and an amino group include N,N-dimethylaminoethyl (meth)acrylate, N,N-diethylaminoethyl (meth)acrylate, N,N-dimethylaminopropyl (meth)acrylate, and N,N-diethylaminopropyl (meth)acrylate.

Examples of the compound having a (meth)acryloyl group and an epoxy group include glycidyl (meth)acrylate, glycidyl α-ethyl (meth)acrylate, glycidyl α-n-propyl (meth) acrylate, glycidyl α-n-butyl (meth)acrylate, 3,4-epoxybutyl (meth)acrylate, 4,5-epoxypentyl (meth)acrylate, 6,7-epoxyheptyl (meth)acrylate, 6,7-epoxyheptyl α-ethyl (meth)acrylate, 3-methyl-3,4-epoxybutyl (meth)acrylate, 4-methyl-4,5-epoxypentyl (meth)acrylate, 5-methyl-5,6-epoxyhexyl (meth)acrylate, β-methylglycidyl (meth)acrylate, and β-methylglycidyl α-ethyl (meth)acrylate.

The monomer component may contain one kind among the above-described additional monomers or may contain two or more kinds thereof.

The content of the additional monomer may be, for example, 1% by mass or more, 5% by mass or more, 10% by mass or more, 20% by mass or more, or 30% by mass or more, and may be 60% by mass or less, 50% by mass or less, or 40% by mass or less, based on the total amount of the thermal insulation material precursor.

The thermal insulation material and the thermal insulation material precursor preferably include thermally expandable hollow particles (hereinafter, also referred to as "first hollow particles") as the hollow particles. A first hollow particle has an outer shell and a hollow portion. A thermally expandable hollow particle according to the present specification is a hollow particle whose maximum volumetric expansion ratio relative to the volume at 25° C. is 10 times or more. When the first hollow particles are used, as the first hollow particles expand due to heat in the reflow step, the adhesion area of the interface between the thermal insulation material and the semiconductor device is reduced, and the thermal insulation material can be easily removed after the reflow step.

The maximum volumetric expansion ratio of the first hollow particles is measured as the ratio between the maximum volume of the first hollow particles and the volume at 25° C. (maximum volume/volume at 25° C.) when temperature is increased at a temperature increase rate of 10° C./min by thermomechanical analysis (TMA). The maximum volumetric expansion ratio of the first hollow particles may be, for example, 20 times or more, 30 times or more, or 40 times or more and may be 120 times or less.

The outer shell of the first hollow particles is preferably composed of a thermoplastic polymer. In this case, since the outer shell is softened by heating, even when the liquid enclosed in the hollow portion is vaporized and the internal pressure increases, the hollow particles are less likely to crack, and the hollow particles expand easily. The thermoplastic polymer may be, for example, a polymer containing acrylonitrile, vinylidene chloride, or the like as a monomer unit. The thickness of the outer shell may be 2 μm or more and may be 15 μm or less.

In the hollow portion of the first hollow particles, for example, a liquid is enclosed. The first hollow particles are in such a state under normal temperature and normal pressure (for example, at least at atmospheric pressure and 30° C.). This liquid is appropriately selected, for example, according to the heating temperature in the reflow step. The liquid is, for example, a liquid that is vaporized at a temperature equal to or lower than the highest heating temperature in the reflow step. The liquid may be, for example, a hydrocarbon having a boiling point (at atmospheric pressure) of 50° C. or higher, 100° C. or higher, 150° C. or higher, or 200° C. or higher. In the hollow portion of the first hollow particles, a gas may be further enclosed in addition to the above-described liquid.

Examples of the component enclosed in the hollow portion of the first hollow particles include hydrocarbons such as propane, propylene, butene, normal butane, isobutane, normal pentane, isopentane, neopentane, normal hexane, isohexane, heptane, isooctane, normal octane, isoalkanes (number of carbon atoms: 10 to 13), and petroleum ether; low-boiling point compounds such as methane halides and tetraalkylsilanes; and compounds that are gasified by thermal decomposition, such as azodicarbonamide.

The average particle size of the first hollow particles may be 5 μm or more, 10 μm or more, or 20 μm or more, and may be 50 μm or less, 40 μm or less, or 30 μm or less. The average particle size of the first hollow particles is measured by a laser diffraction and scattering method (for example, "SALD-7500nano" manufactured by SHIMADZU CORPORATION).

From the viewpoint that a composition is more suitably used as the thermal insulation material in a reflow step (generally heated up to 260° C.), the expansion initiation temperature of the first hollow particles is preferably 70° C. or higher, 100° C. or higher, 130° C. or higher, or 160° C. or higher and is preferably 260° C. or lower. The expansion initiation temperature of the first hollow particles means, in a temperature (axis of abscissa)–volume change (axis of ordinate) profile obtained when temperature is increased at a temperature increase rate of 10° C./min in thermomechanical analysis (TMA), the temperature at an intersection point between the tangent at a point where a volumetric change of 3 times or more/5° C. occurs and a straight line (axis of abscissa) where the volumetric change is zero (initial volume).

The maximum expansion temperature of the first hollow particles is preferably 100° C. or higher, 150° C. or higher, 200° C. or higher, or 220° C. or higher, and is preferably 290° C. or lower, 280° C. or lower, or 270° C. or lower. The maximum expansion temperature of the first hollow particles means the temperature at which the first hollow particles show the above-mentioned maximum volumetric expansion ratio.

From the viewpoint that detachment is further facilitated in the detachment step, the content of the first hollow particles may be preferably 1% by mass or more, more preferably 5% by mass or more, and even more preferably 8% by mass or more, based on the total mass of the thermal insulation material (thermal insulation material precursor), and the content may be 20% by mass or less or 15% by mass or less.

From the viewpoint that detachment is further facilitated in the detachment step, the content of the first hollow particles is preferably 1% by volume or more, more preferably 2% by volume or more, even more preferably 3% by volume or more, and particularly preferably 4% by volume or more, based on the total volume of the thermal insulation material (thermal insulation material precursor), and the content may be, for example, 10% by volume or less, 7% by volume or less, or 5% by volume or less.

From the viewpoint of further improving the thermal insulation properties, the thermal insulation material (thermal insulation material precursor) may further contain hollow particles other than the first hollow particles (hereinafter, also referred to as "second hollow particles"). A second hollow particle has an outer shell and a hollow portion. That is, a second hollow particle is a hollow particle whose maximum volumetric expansion ratio relative to the volume at 25° C. is less than 10 times. The maximum volumetric expansion ratio of the second hollow particles is measured by the same method as that for the maximum volumetric expansion ratio of the first hollow particles.

The outer shell of the second hollow particles may be composed of a polymer or may be composed of an inorganic material. The outer shell is preferably composed of a polymer and is more preferably composed of a thermoplastic polymer. In this case, the hollow particles are less likely to crack even when pressure is applied, and the hollow particles can retain a hollow structure and can maintain thermal insulation properties. The thermoplastic polymer may be, for example, a polymer containing acrylonitrile, vinylidene chloride, or the like as a monomer unit. The inorganic material may be, for example, inorganic glass such as borosilicate glass (sodium borosilicate glass or the like), aluminosilicate glass, or glass obtained by compositizing those. The thickness of the outer shell may be 0.005 μm or more and may be 15 μm or less.

In the hollow portion of the second hollow particles, for example, a gas is enclosed. The second hollow particles are in such a state under normal temperature and normal pressure (for example, at least at atmospheric pressure and 30°

C.). In the hollow portion of the second hollow particles, a liquid may be further enclosed in addition to the gas.

Examples of the component enclosed in the hollow portion of the second hollow particles include hydrocarbons such as propane, propylene, butene, normal butane, isobutane, normal pentane, isopentane, neopentane, normal hexane, isohexane, heptane, isooctane, normal octane, isoalkanes (number of carbon atoms: 10 to 13), and petroleum ether; low-boiling point compounds such as methane halides and tetraalkylsilanes; and decomposition products of compounds that are gasified by thermal decomposition, such as azodicarbonamide. Furthermore, the component enclosed in the hollow portion of the second hollow particles may be air.

From the viewpoint of enhancing the thermal insulation properties, the average particle size of the second hollow particles is preferably 150 μm or less, more preferably 120 μm or less, and even more preferably 100 μm or less, and may be, for example, 5 μm or more, 10 μm or more, 20 μm or more, or 30 μm or more. The average particle size of the second hollow particles is measured by a laser diffraction and scattering method (for example, "SALD-7500nano" manufactured by SHIMADZU CORPORATION).

The density of the second hollow particles may be 500 $kg/m^3$ or less, 300 $kg/m^3$ or less, 100 $kg/m^3$ or less, 50 $kg/m^3$ or less, or 40 $kg/m^3$ or less, and may be 10 $kg/m^3$ or more or 20 $kg/m^3$ or more. The density of the second hollow particles according to the present specification means a density measured by a tapped density method. That is, the density is a density determined by introducing the second hollow particles (about 5 g) into a 10-mL graduated cylinder, tapping the graduated cylinder fifty times, and using the volume when the topmost surface is stabilized as the stable volume and the following formula:

$$\text{Density} = \text{Initial input amount (kg)}/\text{stable volume } (m^3)$$

From the viewpoint of further enhancing the thermal insulation properties, the content of the second hollow particles is preferably 1% by mass or more, more preferably 3% by mass or more, and even more preferably 5% by mass or more, based on the total mass of the thermal insulation material (thermal insulation material precursor), and the content may be, for example, 20% by mass or less.

From the viewpoint of further enhancing the thermal insulation properties, the content of the second hollow particles is preferably 50% by volume or more, and more preferably 60% by volume or more, based on the total volume of the thermal insulation material (thermal insulation material precursor), and the content may be, for example, 95% by volume or less.

The total content of the hollow particles (content including the first hollow particles and the second hollow particles) may be, for example, 5% by mass or more, 10% by mass or more, or 15% by mass or more, based on the total amount of the thermal insulation material (thermal insulation material precursor), and the total content may be 40% by mass or less, 30% by mass or less, or 20% by mass or less.

The total content of the hollow particles (content including the first hollow particles and the second hollow particles) may be, for example, 50% by volume or more, 60% by volume or more, or 70% by volume or more, based on the total volume of the thermal insulation material (thermal insulation material precursor), and the total content may be 95% by volume or less.

The thermal insulation material precursor may further contain a polymerization initiator. The polymerization initiator may be, for example, a thermal polymerization initiator that generates radicals by heat, and a photopolymerization initiator that generates radicals by light. The polymerization initiator is preferably a thermal polymerization initiator.

When the thermal insulation material precursor contains a thermal polymerization initiator, a thermal insulation material can be obtained by curing the precursor by applying heat to the thermal insulation material precursor in the disposition step. In this case, the thermal insulation material precursor may be a thermal insulation material precursor that is cured by heating preferably at 105° C. or higher, more preferably at 110° C. or higher, and even more preferably at 115° C. or higher, and may be a thermal insulation material precursor that is cured by heating at, for example, 200° C. or lower, 190° C. or lower, or 180° C. or lower. The heating time at the time of heating the thermal insulation material precursor may be appropriately selected according to the composition of the thermal insulation material precursor such that the thermal insulation material precursor is suitably cured.

Examples of the thermal polymerization initiator include azo compounds such as azobisisobutyronitrile, azobis-4-methoxy-2,4-dimethylvaleronitrile, azobiscyclohexanone-1-carbonitrile, and azodibenzoyl; and organic peroxides such as benzoyl peroxide, lauroyl peroxide, di-t-butyl peroxide, di-t-hexyl peroxide, di-t-butyl peroxyhexahydroterephthalate, t-butyl peroxy-2-ethylhexanoate, 1,1-t-butyl peroxy-3,3,5-trimethylcyclohexane, and t-butyl peroxyisopropyl carbonate. Regarding the thermal polymerization initiator, these may be used singly or in combination of two or more kinds thereof.

When the thermal insulation material precursor contains a photopolymerization initiator, a thermal insulation material can be obtained by, for example, curing the precursor by irradiating the thermal insulation material precursor with light (for example, light including at least a portion of the wavelengths of 200 to 400 nm (ultraviolet light)) in the disposition step. The conditions for light irradiation may be appropriately set according to the type of the photopolymerization initiator.

Examples of the photopolymerization initiator include a benzoin ether-based photopolymerization initiator, an acetophenone-based photopolymerization initiator, an α-ketol-based photopolymerization initiator, an aromatic sulfonyl chloride-based photopolymerization initiator, a photoactive oxime-based photopolymerization initiator, a benzoin-based photopolymerization initiator, a benzil-based photopolymerization initiator, a benzophenone-based photopolymerization initiator, a ketal-based photopolymerization initiator, a thioxanthone-based photopolymerization initiator, and an acylphosphine oxide-based photopolymerization initiator.

Examples of the benzoin ether-based photopolymerization initiator include benzoin methyl ether, benzoin ethyl ether, benzoin propyl ether, benzoin isopropyl ether, benzoin isobutyl ether, 2,2-dimethoxy-1,2-diphenylethan-1-one (for example, "IRGACURE 651" manufactured by BASF), and anisole methyl ether. Examples of the acetophenone-based photopolymerization initiator include 1-hydroxycyclohexyl phenyl ketone (for example, "IRGACURE 184" manufactured by BASF), 4-phenoxydichloroacetophenone, 4-t-butyl-dichloroacetophenone, 1-[4-(2-hydroxyethoxy)-phenyl]-2-hydroxy-2-methyl-1-propan-1-one (for example, "IRGACURE 2959" manufactured by BASF), 2-hydroxy-2-methyl-1-phenyl-propan-1-one (for example, "IRGACURE 1173" manufactured by BASF), and methoxyacetophenone.

Examples of the α-ketol-based photopolymerization initiator include 2-methyl-2-hydroxypropiophenone and 1-[4-(2-hydroxyethyl)-phenyl]-2-hydroxy-2-methylpropan-1-one. Examples of the aromatic sulfonyl chloride-based photopolymerization initiator include 2-naphthalenesulfonyl chloride. Examples of the photoactive oxime-based photopolymerization initiator include 1-phenyl-1,1-propanedione-2-(o-ethoxycarbonyl)-oxime.

Examples of the benzoin-based photopolymerization initiator include benzoin. Examples of the benzil-based photopolymerization initiator include benzil. Examples of the benzophenone-based photopolymerization initiator include benzophenone, benzoylbenzoic acid, 3,3'-dimethyl-4-methoxybenzophenone, polyvinylbenzophenone, and α-hydroxycyclohexyl phenyl ketone. Examples of the ketal-based photopolymerization initiator include benzyl dimethyl ketal. Examples of the thioxanthone-based photopolymerization initiator include thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, isopropylthioxanthone, 2,4-diisopropylthioxanthone, and dodecylthioxanthone.

Examples of the acylphosphine-based photopolymerization initiator include bis(2,6-dimethoxybenzoyl)phenylphosphine oxide, bis(2,6-dimethoxybenzoyl)(2,4,4-trimethylpentyl)phosphine oxide, bis(2,6-dimethoxybenzoyl)-n-butylphosphine oxide, bis(2,6-dimethoxybenzoyl)-(2-methylpropan-1-yl)phosphine oxide, bis(2,6-dimethoxybenzoyl)-(1-methylpropan-1-yl)phosphine oxide, bis(2,6-dimethoxybenzoyl)-t-butylphosphine oxide, bis(2,6-dimethoxybenzoyl)cyclohexylphosphine oxide, bis(2,6-dimethoxybenzoyl)octylphosphine oxide, bis(2-methoxybenzoyl)(2-methylpropan-1-yl)phosphine oxide, bis(2-methoxybenzoyl)(1-methylpropan-1-yl)phosphine oxide, bis(2,6-diethoxybenzoyl)(2-methylpropan-1-yl)phosphine oxide, bis(2,6-diethoxybenzoyl)(1-methylpropan-1-yl)phosphine oxide, bis(2,6-dibutoxybenzoyl)(2-methylpropan-1-yl)phosphine oxide, bis(2,4-dimethoxybenzoyl)(2-methylpropan-1-yl)phosphine oxide, bis(2,4,6-trimethylbenzoyl)(2,4-dipentoxyphenyl)phosphine oxide, bis(2,6-dimethoxybenzoyl)benzylphosphine oxide, bis(2,6-dimethoxybenzoyl)-2-phenylpropylphosphine oxide, bis(2,6-dimethoxybenzoyl)-2-phenylethylphosphine oxide, 2,6-dimethoxybenzoylbenzylbutylphosphine oxide, 2,6-dimethoxybenzoylbenzyloctylphosphine oxide, bis(2,4,6-trimethylbenzoyl)-2,5-diisopropylphenylphosphine oxide, bis(2,4,6-trimethylbenzoyl)-2-methylphenylphosphine oxide, bis(2,4,6-trimethylbenzoyl)-4-methylphenylphosphine oxide, bis(2,4,6-trimethylbenzoyl)-2,5-diethylphenylphosphine oxide, bis(2,4,6-trimethylbenzoyl)-2,3,5,6-tetramethylphenylphosphine oxide, bis(2,4,6-trimethylbenzoyl)-2,4-di-n-butoxyphenylphosphine oxide, 2,4,6-trimethylbenzoyldiphenylphosphine oxide, bis(2,6-dimethoxybenzoyl)-2,4,4-trimethylpentylphosphine oxide, bis(2,4,6-trimethylbenzoyl)isobutylphosphine oxide, 2,6-dimethoxybenzoyl-2,4,6-trimethylbenzoyl-n-butylphosphine oxide, bis(2,4,6-trimethylbenzoyl)phenylphosphine oxide, bis(2,4,6-trimethylbenzoyl)-2,4-dibutoxyphenylphosphine oxide, 1,10-bis[bis(2,4,6-trimethylbenzoyl)phosphine oxide]decane, and tri(2-methylbenzoyl)phosphine oxide.

The above-mentioned photopolymerization initiators may be used singly or in combination of two or more kinds thereof.

From the viewpoint of suitably carrying out polymerization, the content of the polymerization initiator is preferably 0.01 parts by mass or more, more preferably 0.02 parts by mass or more, and even more preferably 0.05 parts by mass or more, with respect to a total of 100 parts by mass of the monomer components. From the viewpoint that the molecular weight of the polymer in the thermal insulation material is in a suitable range, and the decomposition product is suppressed, the content of the polymerization initiator is preferably 10 parts by mass or less, more preferably 5 parts by mass or less, even more preferably 3 parts by mass or less, and particularly preferably 1 part by mass or less, with respect to a total of 100 parts by mass of the monomer components.

The thermal insulation material and the thermal insulation material precursor can contain a plasticizer as an additive. By using a plasticizer, the adhesiveness of the thermal insulation material precursor and the elongation of the thermal insulation material can be further enhanced. Examples of the plasticizer include butadiene rubber, isoprene rubber, silicone rubber, styrene-butadiene rubber, chloroprene rubber, nitrile rubber, butyl rubber, ethylene-propylene rubber, urethane rubber; tackifiers such as an acrylic resin, a rosin-based resin, and a terpene-based resin; and a polyalkylene glycol. The content of the plasticizer may be 0.1 parts by mass or more, 1 part by mass or more, or 3 parts by mass or more and may be 20 parts by mass or less, 15 parts by mass or less, 12 parts by mass or less, or 10 parts by mass or less, with respect to a total of 100 parts by mass of the monomer components.

The thermal insulation material and the thermal insulation material precursor can further contain an additional additive as necessary. Examples of the additional additive include an antioxidant, a surface treatment agent (for example, a silane coupling agent), a dispersant, a colorant, a crystal nucleating agent, a thermal stabilizer, a foaming agent, a flame retardant, a damping agent, a dehydrating agent, and a flame retardant aid (for example, a metal oxide). The content of the additional additive may be 0.1% by mass or more and may be 30% by mass or less, based on the total amount of the thermal insulation material (thermal insulation material precursor).

The thermal insulation material precursor is preferably liquid at 25° C. As a result, the thermal insulation material precursor can be suitably applied on the surface of a semiconductor device, and the adhesiveness to a coating surface can also be enhanced. The thermal insulation material precursor may be solid at 25° C., and in that case, it is preferable that the thermal insulation material precursor becomes liquid by heating (for example, at 50° C. or higher). The thermal insulation material precursor may be applied in a liquid state and then cured, and as a result, the thermal insulation material precursor can be prevented from causing liquid dripping and a pump-out phenomenon.

The thickness of the sheet disposed on the semiconductor device is not particularly limited, and the thickness may be, for example, 200 μm or more and may be 2000 μm or less.

In the reflow step following the disposition step, reflow of the semiconductor device is performed by a known method. Specifically, for example, the semiconductor device is put into a reflow furnace, the temperature inside the furnace is gradually increased to reach a maximum temperature of 240° C. to 260° C., and then the temperature is gradually decreased. As a result, the solder paste is sintered, and the wiring board is electrically connected to the substrate.

In the detachment step following the reflow step, the thermal insulation material is detached from the semiconductor device. The method for detachment is not particularly limited and may be, for example, a method of detaching the thermal insulation material by attaching an adhesive film to the thermal insulation material and pulling the adhesive film.

The method for detachment may also be, for example, a method of detaching the thermal insulation material by pressing a roller against the thermal insulation material, with a support film interposed therebetween, by using a tape remover (for example, "OTR-600SA" manufactured by OHMIYA IND CO., LTD.) and winding the thermal insulation material together with the support film.

EXAMPLES

Hereinafter, the present invention will be described more specifically based on a Production Example of the thermal insulation material, however, the present invention is not intended to be limited to this Production Example.

[Synthesis of Compound Represented by Formula (1-5)]

A 500-mL flask equipped with a stirrer, a thermometer, a nitrogen gas inlet tube, a discharge tube, and a heating jacket was used as a reactor, 225 g of a glycol having a polyoxyalkylene chain ("NEWPOL 7511-90000" manufactured by Sanyo Chemical Industries, Ltd.) and 300 g of toluene were introduced into the reactor, the mixture was stirred at 45° C. and a speed of stirring rotation of 250 times/min, nitrogen was allowed to flow at a rate of 100 mL/min, and the mixture was stirred for 30 minutes. Subsequently, the temperature was lowered to 25° C., and after completion of the temperature lowering, 2.9 g of acryloyl chloride was added dropwise into the reactor, followed by stirring for 30 minutes. Subsequently, 3.8 g of triethylamine was added dropwise, and the mixture was stirred for 2 hours. Subsequently, the temperature was raised to 45° C., and the mixture was allowed to react for 2 hours. The reaction liquid was filtered, the filtrate was desolvated, and a compound represented by the Formula (1-5) (weight average molecular weight: 15000, a mixture in which m1+m2 in the Formula (1-5) represents an integer of approximately 252±5, n1+n2 represents an integer of approximately 63±5 (provided that m1, m2, n1, and n2 are each an integer of 2 or greater, m1+n1≥100, and m2+n2≥100), viscosity at 25° C.: 50 Pa·s) was obtained.

[Chemical Formula 7]

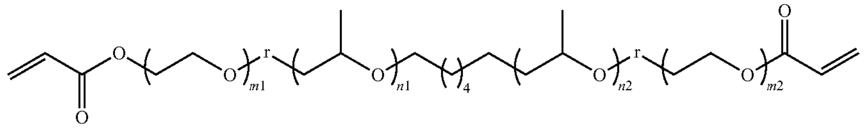

(1-5)

[in the Formula (1-5), -r- is a symbol representing random copolymerization.]

[Production of Thermal Insulation Material]

39.2 parts by mass of a compound represented by the Formula (1-5), 23.5 parts by mass of dicyclopentanyl acrylate ("FANCRYL (registered trademark) FA-513A" manufactured by Showa Denko Materials Co., Ltd.), 15.7 parts by mass of 4-hydroxybutyl acrylate (manufactured by OSAKA ORGANIC CHEMICAL INDUSTRY LTD.), 11.0 parts by mass of first hollow particles ("MATSUMOTO MICROSPHERE (registered trademark) F-190SSD" manufactured by Matsumoto Yushi-Seiyaku Co., Ltd., average particle size: 10 to 15 μm, maximum volumetric expansion ratio: 50 times or more, expansion initiation temperature: 155° C. to 165° C., maximum expansion temperature: 210° C. to 220° C.), 5.8 parts by mass of second hollow particles ("EXPANCEL (registered trademark) 920 DE80d30" manufactured by Japan Fillite Co., Ltd., average particle size 60 to 90 μm, density 30±3 kg/$m^3$, maximum volumetric expansion ratio: less than 5 times), 0.9 parts by mass of a polymerization initiator (perbutyl oxide, "PERBUTYL (registered trademark) O" manufactured by NOF CORPORATION), 3.1 parts by mass of a phenol-based antioxidant ("ADEKA STAB (registered trademark) AO-80" manufactured by ADEKA Corporation), and 0.8 parts by mass of a surface adjusting agent ("BYK (registered trademark) 350" manufactured by BYK Japan K.K.) were mixed, and a thermal insulation material precursor was obtained.

Next, two sheets of substrates were prepared by placing a mold release-treated PET sheet ("A31" manufactured by TOYOBO CO., LTD.) on a glass plate, with the mold release-treated surface facing upward. A formwork made of silicone rubber and having a size of 10 cm×15 cm×1.0 mm was installed on the PET sheet of one of the substrates, and the inner side of the formwork was filled with the thermal insulation material precursor. In addition, the other substrate was used as an upper lid by placing the mold release-treated surface of the PET sheet of the other substrate on the thermal insulation material precursor side, and then the thermal insulation material precursor was cured by heating for 15 minutes under the conditions of 135° C. As a result, a sheet-shaped thermal insulation material (thickness 1.0 mm) was obtained.

[Measurement of Adhesive Strength]

The produced thermal insulation material was stuck to a slide glass plate and left to stand for 15 minutes or longer, and then three kinds of samples:

[1] in an unheated state at 25° C.,

[2] in a state of being heated at 220° C. for 120 seconds and then cooled to 25° C., and

[3] in a state of being heated at 260° C. for 30 seconds and then cooled to 25° C., were prepared. For these samples [1], [2], and [3], the adhesive strengths F0, F1, and F2 were respectively measured by using "EZ Test EZ-S" manufactured by SHIMADZU CORPORATION (90° peeling, tensile rate: 50 mm/min). The results were as follows.

F0: 29 N/m

F1: ≥200 N/m (when it was attempted to peel off the sample, the thermal insulation material underwent cohesive failure and could not be peeled off)

F2: 12 N/m.

As described above, it was found that since this thermal insulation material has large F1, the thermal insulation material can be suitably attached to a semiconductor device during the reflow step and can protect the semiconductor device from heat, and at the same time, since the thermal insulation material has small F2, the thermal insulation material can be easily removed in the detachment step after the reflow step.

[Measurement of Thermal Conductivity]

The produced thermal insulation material was cut into a size of 8 cm×13 cm×1.0 mm in a state of being sandwiched between the PET sheets, this cut piece was sandwiched between a reference plate and a measurement probe, and the thermal conductivity was measured with a rapid thermal conductivity meter ("QTM-710" manufactured by Kyoto Electronics Manufacturing Co., Ltd., measurement probe PD-11N, thin film measurement mode) under the conditions of 25° C. The reference was measured by stacking two sheets of mold release-treated PET ("A31" manufactured by TOYOBO CO., LTD.) and sandwiching the sheets between a reference plate and a measurement probe. The thermal conductivity of the thermal insulation material was 66 mW/(m·K).

[Evaluation of Thermal Insulation Characteristics]

A thermocouple was stuck to a substrate (MCL-E-700GR manufactured by Showa Denko K.K., copper was already etched), the thermal insulation material obtained as described above was stuck to the substrate so as to sandwich the thermocouple, and a sample was produced. The thermal insulation material surface of this sample was placed on a hot plate heated to 200° C., the time t required for the temperature on the substrate to be stabilized and the temperature T1 when the temperature was stabilized were measured, and at the same time, the temperature T2 on the hot plate was measured as well. The difference (T1−T2) between the temperature T1 on the substrate and the temperature T2 on the hot plate was calculated, which was −47° C., and the time t required for the temperature on the substrate to be stabilized was 52 seconds.

On the other hand, for a comparison, measurement was carried out in the same manner as described above without using a thermal insulation material, and the difference (T1−T2) was 0° C., while the time t was 1 second.

Thus, it was found that the thermal insulation material has an excellent thermal insulation effect.

REFERENCE SIGNS LIST

1A, 1B, 11A, 11B: semiconductor device, 2, 12: substrate, 3: solder (solder paste), 4: lead, 5: wire, 6, 16: semiconductor chip, 7: die attach material, 8: die pad, 9, 17: encapsulant material, 10, 18: thermal insulation material, 13: solder (solder ball), 14: interposer, 15: bonding adhesive, 16*a*: protruding electrode.

The invention claimed is:

1. A method for manufacturing a semiconductor device, the method comprising:

a step of disposing an adhesive thermal insulation material on a semiconductor device;

a step of performing reflow of the semiconductor device having the adhesive thermal insulation material disposed thereon; and a step of detaching the adhesive thermal insulation material from the semiconductor device, wherein the adhesive thermal insulation material satisfies the following Formula (A):

$$F1>F2 \quad \text{(A)}$$

wherein, in the Formula (A), F1 represents the adhesive strength of the adhesive thermal insulation material after heating the adhesive thermal insulation material at 220° C. for 120 seconds, and F2 represents the adhesive strength of the adhesive thermal insulation material after heating the adhesive thermal insulation material at 260° C. for 30 seconds.

2. The method for manufacturing a semiconductor device according to claim 1, wherein the adhesive thermal insulation material satisfies the following Formula (B):

$$F0\leq F1 \quad \text{(B)}$$

wherein, in the Formula (B), F0 represents the adhesive strength of the adhesive thermal insulation material at 25° C., and F1 represents the adhesive strength of the adhesive thermal insulation material after heating the adhesive thermal insulation material at 220° C. for 120 seconds.

3. The method for manufacturing a semiconductor device according to claim 1, wherein the adhesive thermal insulation material contains a matrix polymer and thermally expandable hollow particles.

4. The method for manufacturing a semiconductor device according to claim 1, wherein the adhesive thermal insulation material molded in advance into a sheet shape is disposed in the step of disposing the adhesive thermal insulation material.

5. The method for manufacturing a semiconductor device according to claim 1, wherein a liquid thermal insulation material precursor is disposed on the semiconductor device, and then the liquid thermal insulation material precursor is cured in the step of disposing the adhesive thermal insulation material.

6. A method for manufacturing a semiconductor device, the method comprising:

a step of disposing an adhesive thermal insulation material on a semiconductor device;

a step of performing reflow of the semiconductor device having the adhesive thermal insulation material disposed thereon; and a step of detaching the adhesive thermal insulation material from the semiconductor device, wherein the adhesive thermal insulation material satisfies the following Formula (B):

$$F0\leq F1 \quad \text{(B)}$$

wherein, in the Formula (B), F0 represents the adhesive strength of the adhesive thermal insulation material at 25° C., and F1 represents the adhesive strength of the adhesive thermal insulation material after heating the adhesive thermal insulation material at 220° C. for 120 seconds.

7. The method for manufacturing a semiconductor device according to claim 6, wherein the adhesive thermal insulation material contains a matrix polymer and thermally expandable hollow particles.

8. The method for manufacturing a semiconductor device according to claim 6, wherein the adhesive thermal insulation material molded in advance into a sheet shape is disposed in the step of disposing the adhesive thermal insulation material.

9. The method for manufacturing a semiconductor device according to claim 6, wherein a liquid thermal insulation material precursor is disposed on the semiconductor device, and then the liquid thermal insulation material precursor is cured in the step of disposing the adhesive thermal insulation material.

* * * * *